United States Patent
Hartikainen et al.

(10) Patent No.: US 11,572,959 B2
(45) Date of Patent: Feb. 7, 2023

(54) PRESSURE RELIEF ARRANGEMENT

(71) Applicant: ABB Schweiz AG, Baden (CH)

(72) Inventors: Pyry Hartikainen, Helsinki (FI);
Teemu Salmia, Helsinki (FI); Hanna Rapinoja, Helsinki (FI)

(73) Assignee: ABB Schweiz AG, Baden (CH)

( * ) Notice: Subject to any disclaimer, the term of this patent is extended or adjusted under 35 U.S.C. 154(b) by 93 days.

(21) Appl. No.: 17/329,475

(22) Filed: May 25, 2021

(65) Prior Publication Data

US 2021/0388912 A1  Dec. 16, 2021

(30) Foreign Application Priority Data

Jun. 10, 2020 (EP) ................................. EP20179211

(51) Int. Cl.
*F16K 17/04* (2006.01)
*H05K 5/06* (2006.01)
*H02B 1/01* (2006.01)
*H02B 1/30* (2006.01)
*H02B 1/56* (2006.01)

(52) U.S. Cl.
CPC ......... *F16K 17/0413* (2013.01); *H02B 1/013* (2013.01); *H02B 1/306* (2013.01); *H02B 1/565* (2013.01); *H05K 5/068* (2013.01)

(58) Field of Classification Search
CPC ...... F16K 17/0413; H05K 5/068; H02B 1/565
See application file for complete search history.

(56) References Cited

U.S. PATENT DOCUMENTS

| | | | | |
|---|---|---|---|---|
| 10,268,213 | B1* | 4/2019 | Addona | F16K 17/065 |
| 2005/0269321 | A1* | 12/2005 | Bornhof | H05K 5/061 |
| | | | | 220/4.21 |
| 2016/0273670 | A1* | 9/2016 | Karppa | A62C 3/00 |
| 2019/0280269 | A1* | 9/2019 | Weidmann | F16K 17/0493 |
| 2020/0381905 | A1* | 12/2020 | Sasaki | H05K 5/0213 |
| 2022/0099792 | A1* | 3/2022 | Tkaczyk | H05K 5/068 |
| 2022/0146009 | A1* | 5/2022 | Weidmann | F16K 24/04 |

FOREIGN PATENT DOCUMENTS

| CN | 210004162 U | 1/2020 |
|---|---|---|
| CN | 210517575 U | 5/2020 |

OTHER PUBLICATIONS

European Search Report; Application No. EP 20 17 9211; dated Nov. 12, 2020; 2 Pages.

* cited by examiner

*Primary Examiner* — Hung V Ngo
(74) *Attorney, Agent, or Firm* — Whitmyer IP Group LLC

(57) ABSTRACT

The arrangement includes a pressure relief hatch for closing an opening in a wall in an electric cabinet, which. includes a body having an outer surface, an opposite inner surface, an outer perimeter, and a thickness. The body includes a centre portion with a first thickness, an intermediate portion with a second thickness, and an outer portion with a third thickness. The first thickness is greater than the third thickness and the second thickness decreases in a radially outward direction from the first thickness to the third thickness. A spring keeps the pressure relief hatch in a closed position in the opening during normal operation of the electric cabinet.

18 Claims, 4 Drawing Sheets

PRESSURE RELIEF ARRANGEMENT

TECHNICAL FIELD

The present invention relates to a pressure relief arrangement.

BACKGROUND

A pressure relief arrangement may be formed of a pressure relief hatch mounted on an enclosure comprising electrical equipment. A short circuit inside the enclosure may ignite an arc within the enclosure. The arch may heat up the air surrounding the arc causing the air to expand in an explosive manner. The pressure within the enclosure will thus increase causing deformations to the enclosure. The deformations may break the enclosure causing a danger to people outside the enclosure. Pressure relief hatches or other similar means are thus added into closed enclosures in order to discharge the pressure caused by the arc. The pressure will thus be released in a controlled way and in a controlled direction through the pressure relief hatch in the enclosure.

One problem in prior art pressure relief arrangements may be that the area of the pressure release route for the hot gases may not be sufficiently large. A pressure relief hatch providing a small area in the pressure relief route does not release the pressure in a fast and efficient way, whereby a risk for an explosive break of the enclosure increases.

SUMMARY

An object of the present invention is to achieve an improved pressure relief arrangement.

The pressure relief arrangement according to the invention is defined in claim 1.

The pressure relief arrangement comprises a pressure relief hatch for closing an opening in a wall in an electric cabinet, the pressure relief hatch comprising a body having an outer surface, an opposite inner surface, an outer perimeter, and a thickness in a direction perpendicular to a radial plane closing the opening, the body comprising a centre portion having a first thickness, an intermediate portion having a second thickness and extending radially outwards from the centre portion, and an outer portion having a third thickness and extending radially outwards from the intermediate portion to the outer perimeter, the first thickness being greater than the third thickness, a spring extending across the pressure relief hatch within the electric cabinet, the spring being supported on an inner surface of the wall of the electric cabinet and attached to an inner surface of the centre portion of the body of the pressure relief hatch for keeping the pressure relief hatch in a closed position in the opening during normal operation of the electric cabinet.

The arrangement is characterized in that the second thickness decreases in a radially outward direction from the first thickness to the third thickness, the outer perimeter of the pressure relief hatch extends radially beyond an edge of the opening in the wall of the electric cabinet so that the inner surface of the outer portion of the body of the pressure relief hatch seats on an outer surface of the wall in a closed position of the pressure relief hatch.

The inventive pressure relief arrangement may be used especially in narrow spaces for providing an effective and wide enough exhaust passage for the hot gases during a short circuit within the electric cabinet or some other phenomena creating a significant pressure difference between an inside and an outside of the electric cabinet.

The pressure within the electric cabinet starts to discharge earlier in the inventive pressure relief arrangement compared to prior art solutions as a large exhaust passage is provided immediately when the pressure release hatch starts to open.

The pressure release hatch will, also in an abnormal situation in which it is only partly opened, provide a large exhaust passage for hot gases. The abnormal situation may be caused by a foreign object e.g. a small stone positioned between the pressure relief hatch and a rigid surface opposite to the pressure relief hatch further restricting the opening of the pressure relief hatch.

The operation of the pressure release hatch will be reliable because the manufacturing tolerances of the opening and the hatch do not play a decisive role in determining the area of the exhaust passage provided by the hatch compared to prior art solutions in which the hatch is sealed in the opening.

An embodiment of the invention may comprise a groove surrounding the opening in the wall. The groove may receive a seal, whereby the seal may act on the inner surface of the outer portion of the body of the pressure relief hatch in order to seal the opening when the pressure relief hatch is in the closed position.

The seal will not as such have any adverse impact on the opening of the pressure relief hatch. The pressure relief hatch opens in a level transition in relation to the wall in the electric cabinet. The pressure relief hatch does not have any surfaces that would glide on an opposite surface in the wall during the opening of the pressure relief hatch.

The seal could be a level seal being positioned between the outer portion of the body of the pressure relief hatch and the wall of the electric cabinet. The seal could extend over the whole surface of the outer portion of the body of the pressure relief hatch. The seal may be a separate part or an integral part of the pressure relief hatch or the electric cabinet. The level seal would eliminate direct contact between the pressure relief hatch and the wall. Such a construction would eliminate the problem with corrosion between the pressure relief hatch and the wall, which might affect the opening of the pressure relief hatch.

The pressure relief hatch may easily be scaled to different sizes in order to achieve a desired exhaust area in different applications.

It is also possible to install several pressure relief hatches into an electric cabinet in order to achieve a desired exhaust area. All hatches may be provided with springs having identical spring constants or with springs having different spring constants. The use of springs with different spring constants will result in a non-simultaneous opening of the pressure relief hatches. The pressure relief from the electric cabinet to the surrounding of the electric cabinet may thus be made graduate by using springs with different spring constants in the pressure relief hatches.

The pressure relief hatch may prolong the safe operation time in a fault or it may even eliminate the danger of mechanical break-down of the electric cabinet all together. Slower and cheaper protection equipment may thus be used for the protection of the electric cabinet.

BRIEF DESCRIPTION OF THE DRAWINGS

In the following the invention will be described in greater detail by means of preferred embodiments with reference to the attached drawings, in which.

DETAILED DESCRIPTION

Figure 1:
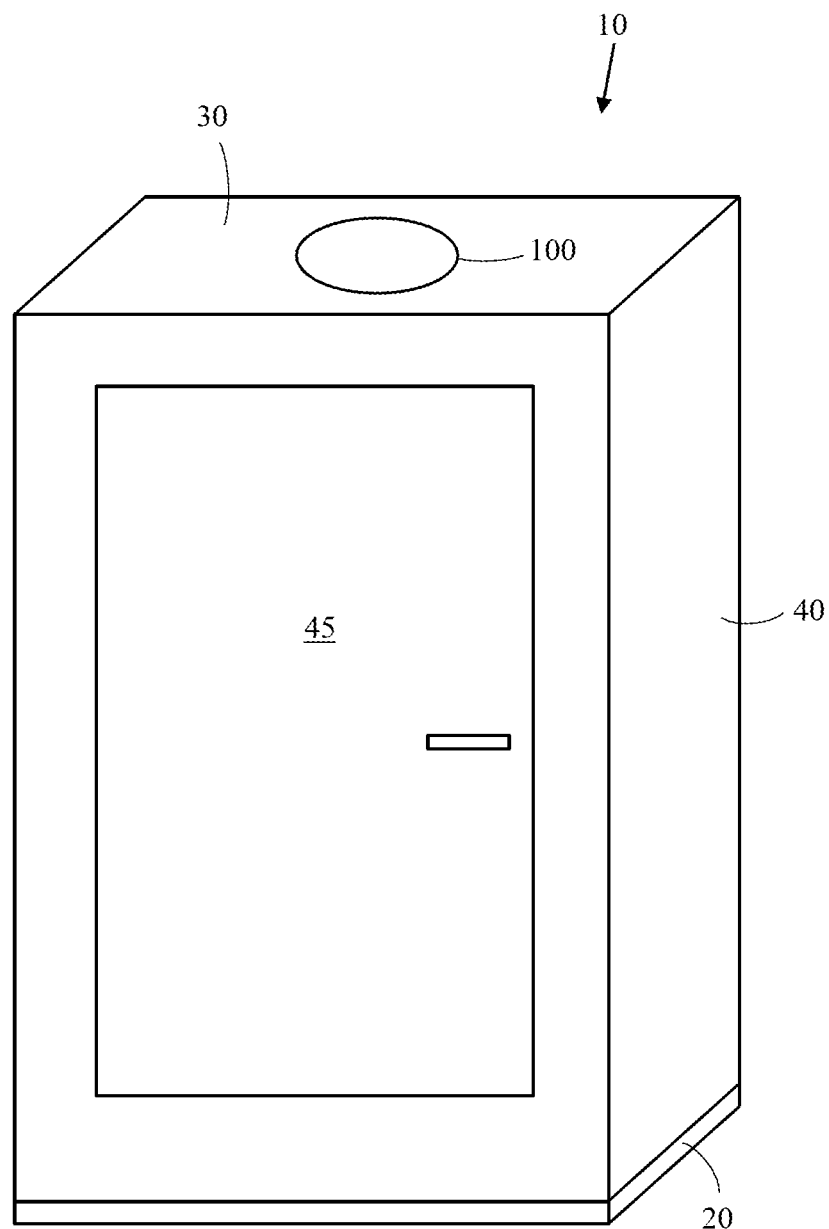
FIG. 1 shows an electric cabinet with a pressure relief arrangement.

FIG. 1 shows an electric cabinet with a pressure relief arrangement.

The electric cabinet 10 comprises a bottom 20, a roof 30 and side walls 40 extending between the bottom 20 and the roof 30 of the electric cabinet 10. A front wall of the electric cabinet 10 may comprise a door 45. A pressure relief arrangement based on a pressure relief hatch 100 may be positioned on the roof 30 of the electric cabinet 10. The pressure relief hatch 100 could, however, be positioned on any wall 40 of the electric cabinet 10. The wall 40 could be an outer side wall or on an inner side wall of the electric cabinet 10. The electric cabinet 10 may comprise electric equipment, such as busbars, electric drives for electric motors, etc.

The pressure relief hatch 100 may be positioned in connection with an opening in the wall 30, 40 of the electric cabinet 10.

Figure 2:
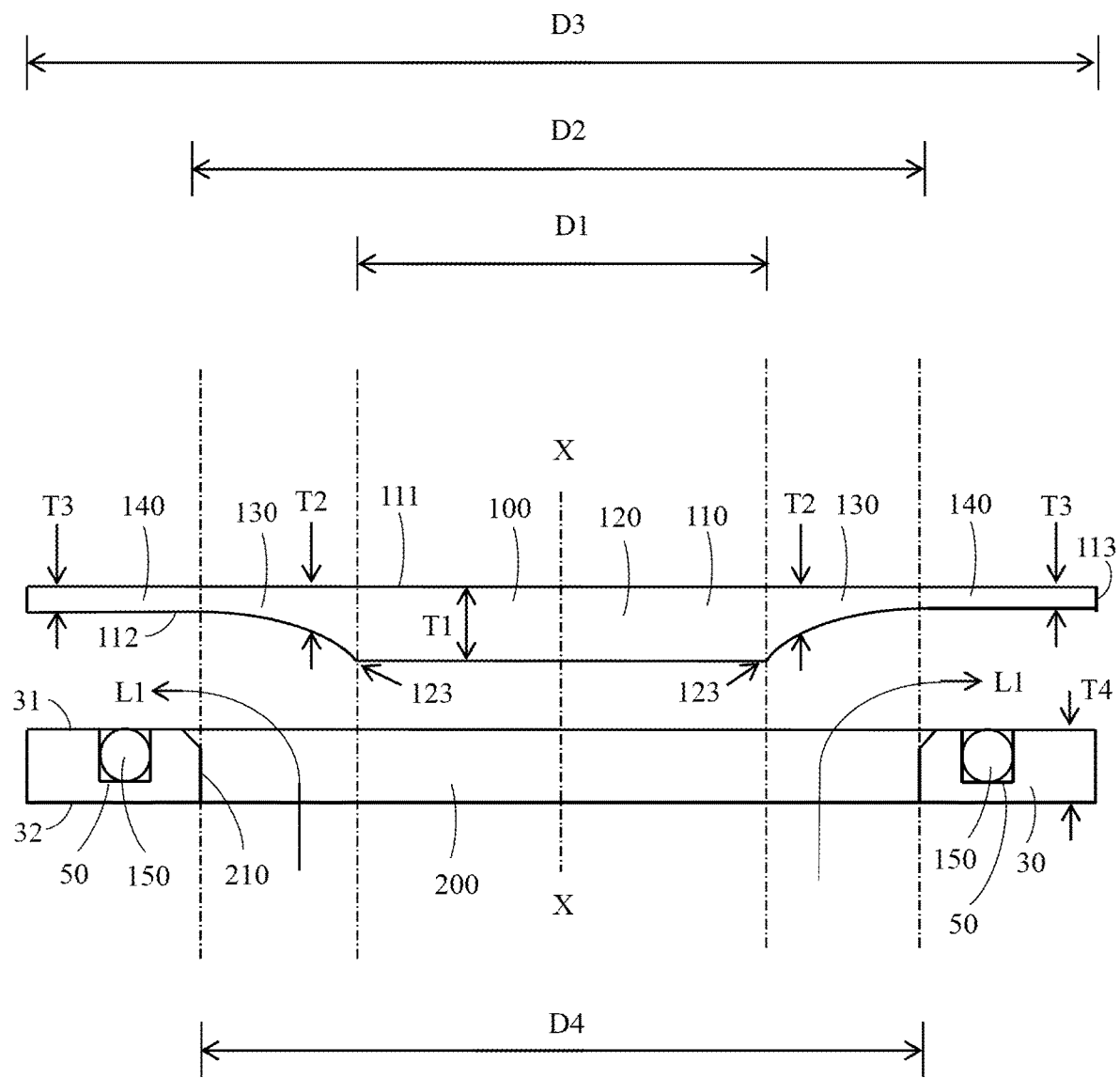
FIG. 2 shows a pressure relief arrangement according to the invention.

FIG. 2 shows a pressure relief arrangement according to the invention.

The pressure relief arrangement may comprise a pressure relief hatch 100. The pressure relief hatch 100 may comprise a body 110. The body 110 may have an outer perimeter 113 and a thickness T in a direction perpendicular to a plane closing the opening 200 in the wall 30 of the electric cabinet 10. The body 110 may also have a centre axis X-X perpendicular to the planar piece in case the body 110 is symmetrical. The body 110 may comprise a centre portion 120, an intermediate portion 130 and an outer portion 140. The vertical dashed lines indicate the transitions between the centre portion 120, the intermediate portion 130 and the outer portion 140. The centre portion 120 may have a first thickness T1 and extend radially outwards from the centre axis X-X. The intermediate portion 130 may have a second thickness T2 and extend radially outwards from the centre portion 120. The outer portion 140 may have a third thickness T3 and extend radially outwards from the intermediate portion 130 to the outer perimeter 113. The first thickness T1 may be greater than the third thickness T3. The second thickness T2 may decrease in a radially outward direction from the first thickness T1 to the third thickness T3.

The body 110 of the pressure relief hatch 100 may have a circular shape. The outer perimeter of the centre portion 120 may be defined by a first outer diameter D1. The outer perimeter of the intermediate portion 130 may be defined by a second diameter D2. The outer perimeter 113 of the outer portion 140 may be defined by a third diameter D3. The third diameter D3 may also define the outer perimeter 113 of the body 110 of the pressure relief hatch 100. The inner perimeter of the intermediate portion 130 coincides with the outer perimeter 123 of the centre portion 120. The outer perimeter of the intermediate portion 130 coincides with the inner perimeter of the outer portion 140. The first diameter D1 may be smaller than the second diameter D2 and the second diameter D2 may be smaller than the third diameter D3.

The thickness T1 of the centre portion 120 may be uniform throughout the centre portion 120. The thickness T3 of the outer portion 140 may be uniform throughout the outer portion 140. The thickness T3 of the outer portion 140 may be smaller than the thickness T1 of the centre portion 120. The thickness T2 of the intermediate portion 130 at the outer perimeter of the intermediate portion 130 may be the same as the thickness T3 of the outer portion 140. The thickness T2 of the intermediate portion 130 at the inner perimeter of the intermediate portion 130 may be the same as the thickness T1 of the centre portion 120. The thickness T2 of the intermediate portion 130 is thus variable so that it decreases from the first thickness T1 to the third thickness T3 in the radially outwards direction of the pressure relief hatch 110.

The outer surface 111 of the body 110 of the pressure relief hatch 100 may be planar. The inner surface 112 of the body 110 of the pressure relief hatch 100 may be formed of three portions. The inner surface of the centre portion 120 may be planar. The inner surface of the intermediate portion 130 may be curved. The inner surface of the outer portion 140 may be planar. The curve of the inner surface of the intermediate portion 130 may be smooth.

The wall 30 of the electric cabinet 10 may comprise an outer surface 31 and an opposite inner surface 32, as well as an opening 200 passing through the wall 30 between the outer surface 31 and the inner surface 32 of the wall 30. The opening 200 has an edge 210 defining the opening 200. The opening 200 may be circular. The wall 30 may further comprise a groove 50 surrounding the opening 200. The groove 50 may form a recess in the wall 30. The recess 50 may be open at the outer surface 31 of the wall 30 and extend a distance inwards from the outer surface 31 of the wall 30. A seal 150 may be positioned in the groove 50. The seal 150 may be formed of an O-ring seal or of a flat seal. The pressure relief hatch 100 is shown in an open position in the figure i.e. the opening 200 in the wall 30 is open. An exhaust passage L1 for hot gases to pass out from the electric cabinet 10 is thus formed through the opening 200 upwards and outwards along the space formed between the open pressure relief hatch 100 and the outer surface 31 of the wall 30.

The opening 200 in the wall 30 of the electric cabinet 10 may be circular. The opening 200 may be defined by a fourth diameter D4. The fourth diameter D4 may coincide with the second diameter D2. The outer perimeter of the intermediate portion 130 of the body 110 of the pressure relief hatch 100 would thus coincide with the edge 210 of the opening 200.

The wall 30 in the electric cabinet 10 may have a thickness T4. The thickness T4 of the wall 30 may be slightly larger than the thickness T1 of the centre portion 120 of the pressure relief hatch 110.

The outer portion 140 or a portion of the outer portion 140 of the body 110 of the pressure relief hatch 100 may surround the opening 200. The outer portion 140 of the body 110 of the pressure relief hatch 100 may in the closed position seat on the outer surface 31 of the wall 30 of the electric cabinet 10. The outer portion 140 of the body 110 of the pressure relief hatch 100 may in the closed position seat against the seal 150. The opening 200 will thus be sealed towards the outside of the electric cabinet 10. The centre portion 120 of the body 110 of the pressure relief hatch 100 will protrude into the opening 200 in the wall 30 in the closed position of the pressure relief hatch 100. The intermediate portion 130 of the body 110 of the pressure relief hatch 100 will also be positioned in the opening 200 in the wall 30 in the closed position of the pressure relief hatch 110.

The pressure relief hatch 110 provides an exhaust passage L1 with a big area. The smooth curved form of the inner surface 112 of the body 110 of the pressure relief hatch 110 forms an optimal guiding surface for the fluid flowing out of the electric cabinet 10.

Figure 5:
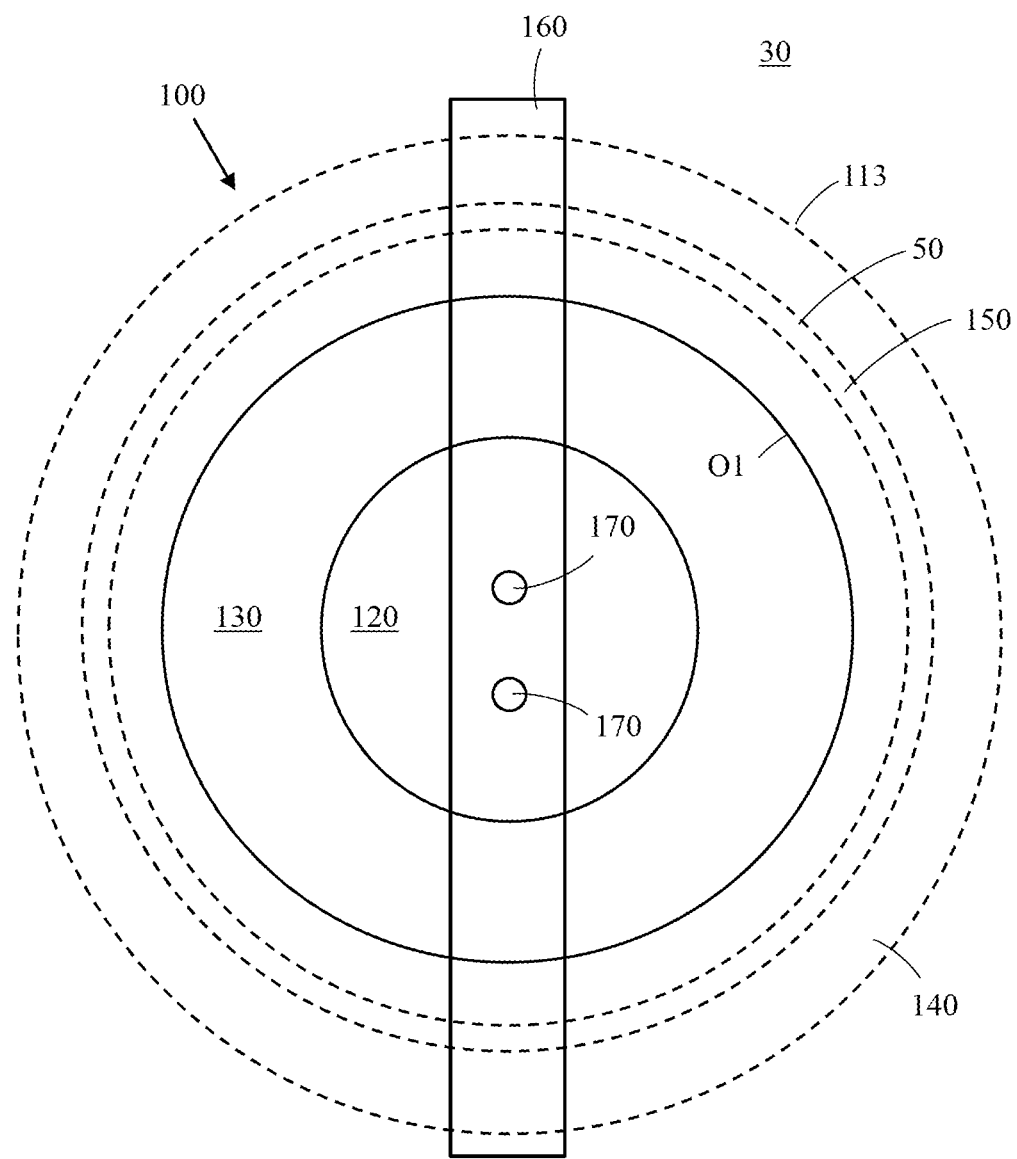
FIG. 5 shows a bottom view of the pressure relief arrangement according to FIG. 2.

The thicker centre portion 120 of the body 110 of the pressure relief hatch 100 makes it possible to use a simple flat spring 160 shown in FIG. 5. The thicker centre portion 120 makes it possible to attach the spring 160 with screws to the centre portion 120. There is enough space to provide a threading for the screws in the centre portion 120.

Figure 3:
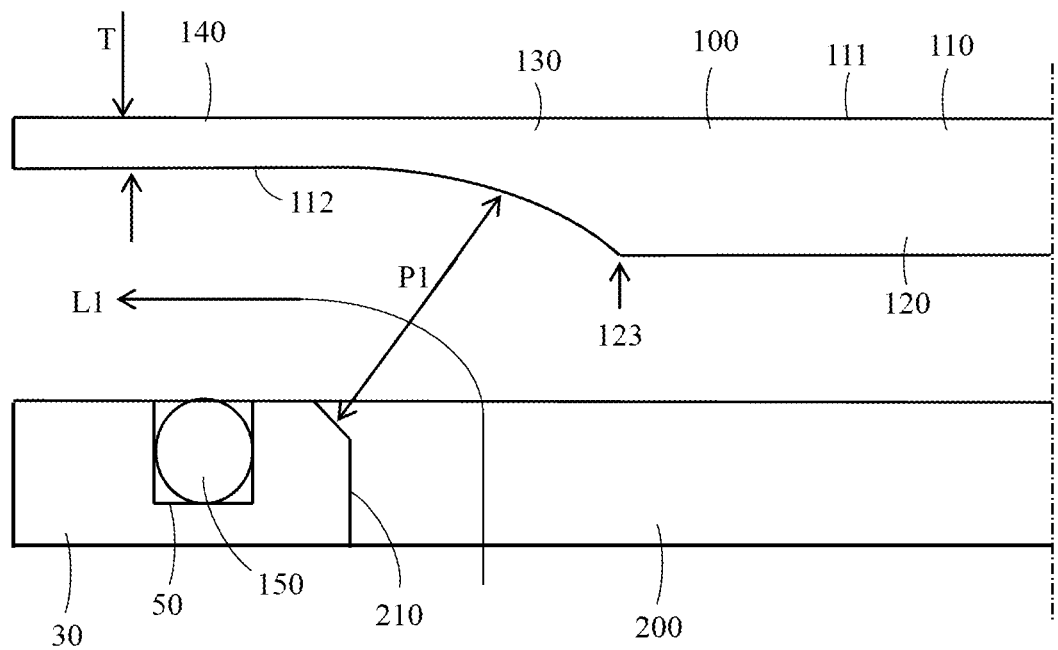
FIG. 3 shows an enlargement of one side of the pressure relief arrangement according to FIG. 2 in an open position.
Figure 4:
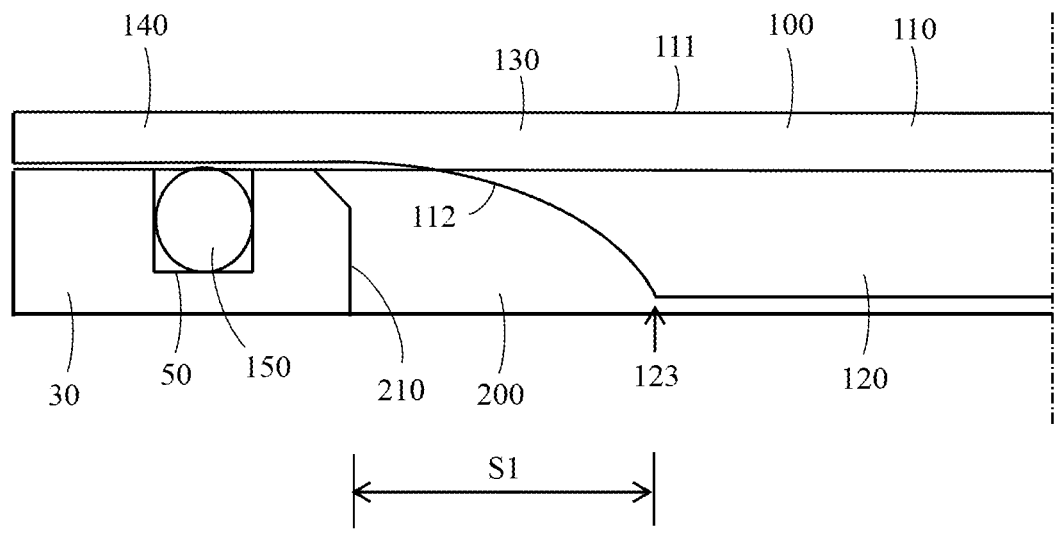
FIG. 4 shows an enlargement of one side of the pressure relief arrangement according to FIG. 2 in a closed position.

FIG. 3 shows an enlargement of one side of the pressure relief arrangement according to FIG. 2 in an open position and FIG. 4 in a closed position.

The form of the pressure relief hatch 100 provides for an exhaust passage L1 for hot gases with a large area P1 although the pressure relief hatch 100 may open only to a limited extent. The space outside the outer surface 111 of the body 110 of the pressure relief hatch 100 may be limited, whereby the opening of the pressure relief hatch 100 is restricted. The pressure relief hatch 100 should according to safety regulations open against a stiff non-flammable surface.

The position of the seal 150 in a groove 50 in the wall 30 of the electric cabinet 10 is an advantageous embodiment. The seal 150 acts between two parallel surfaces i.e. the inner surface 112 of the body 110 of the pressure relief hatch 100 and the outer surface 31 of the wall 30 of the electric cabinet 10. The pressure relief hatch 100 moves in a level transition away from the wall 30. The pressure relief hatch 100 moves thus freely away from the wall 30. There are no surfaces gliding along each other when the pressure relief hatch 100 opens. Friction caused by surfaces gliding along each other is thus eliminated totally. Factors that could prevent a fast and efficient opening of the pressure relief hatch 100 due to an overpressure within the electric cabinet 10 are thus eliminated in the solution.

The outer perimeter 123 of the centre portion 120 of the body 110 of the pressure relief hatch 100 may be positioned at a radial distance S1 inwards from the edge 210 of the opening 200 in the wall 30 of the electric cabinet 10 in a closed position of the pressure relief hatch 100. This contributes to achieve an exhaust passage L1 for hot gases with a large area P1 although the pressure relief hatch 100 may open only to a limited extent.

FIG. 5 shows a bottom view of the pressure relief arrangement according to FIG. 2.

The figure shows the pressure relief arrangement from the inside of the electric cabinet 10. The outermost broken line denotes the outer perimeter 113 of the body 110 of the pressure relief hatch 100 on the outer surface of the wall 30 of the electric cabinet 10. The two outermost broken lines denotes the groove 50 for the seal 150 in the wall 20 of the electric cabinet 10. The groove 50 opens to the outside of the wall 30 of the electric cabinet 10. The outermost unbroken line denotes the edge 210 of the opening 200 in the wall 30 of the electric cabinet 10. The innermost unbroken line denotes the centre portion 120 of the body 110 pressure relief hatch 100 within the electric cabinet 10. A spring 160 may extend across the pressure relief hatch 100 inside the electric cabinet 10. The spring 160 may be attached with screws 170 to the centre portion 120 of the body 110 of the pressure relief hatch 100. The outer ends of the spring 160 extend to the inner surface 32 of the wall 30 of the electric cabinet 30. The spring 160 keeps the pressure relief hatch 100 in position on the opening 200 so that the opening 200 becomes closed. The spring 160 presses the pressure relief hatch 100 towards the outer surface 31 of the wall 30 of the electric cabinet 10. The inner surface 112 of the outer portion 140 of the body 110 of the pressure relief hatch 100 will thus be pressed against the seal 150.

The spring 160 may be dimensioned so that the pressure relief hatch 100 will open against the force of the spring 160 when a short circuit takes place within the electric cabinet 10 so that the explosive gases may pass out from the opening 200 in the wall 30 of the electric cabinet 10 and further along the passage P1 formed between the open pressure relief hatch 100 and the wall 30 of the electric cabinet 10.

The spring 160 may have the form of a substantially rectangular flat piece. The spring 160 may be formed of a flexible material e.g. spring steel. The spring 160 may thus be a leaf spring or a flat spring.

The spring 160 is symmetrical in this embodiment i.e. the spring 160 extends across the pressure relief hatch 100 to the inner surface 32 of the wall 30. A symmetric spring 160 will cause a level transition of the pressure relief hatch 100 due to the over pressure within the electric cabinet 10. The pressure relief hatch 100 will thus move in the direction of the centre line X-X away from the wall 30 of the electric cabinet 10. The spring 160 could, however, also be asymmetric e.g. so that the spring 160 extends only from the centre portion 120 of the body 110 of the pressure relief hatch 100 to the inner surface 32 of the wall 30 of the electric cabinet 10.

The pressure relief hatch 100 is in the embodiment shown in the figures formed of a circular plate. This is an advantageous embodiment, but the pressure relief hatch 100 could be formed of a plate having any symmetric or asymmetric geometric form. The form of the pressure relief hatch 100 could e.g. be circular, elliptic, rectangular, or polygonal. The centre portion 120 of the body 110 of the pressure relief hatch 100 could be circular even if the outer perimeter 113 of the pressure relief hatch 100 has some other symmetric or asymmetric geometrical form. The centre portion 120 of the body 110 of the pressure relief hatch 100 could have a symmetric or asymmetric form. The centre portion 120 could e.g. be the circular, elliptic, rectangular, or polygonal. The opening 200 in the wall 30 of the electric cabinet 10 would then have to be adapted to the form of the centre portion 120 of the body 110 of the pressure relief hatch 100.

The inner surface 112 of the intermediate portion 130 of the body 110 of the pressure relief hatch 100 is curved in the embodiment in the figures. This is an advantageous embodiment, but the inner surface 112 could as an alternative be formed by an inclined line.

The groove 50 may be formed in the wall 30 of the electric cabinet 10. The other possibility would be to attach a separate flange to the wall 30 of the electric cabinet 10. The flange would surround the opening 200 in the wall 30. The flange would comprise the groove and the seal. The separate flange could be attached to a plain surface of the wall 30.

The seal 150 is in the figure formed of an O-ring positioned in a groove 50. This is an advantageous embodiment, but the seal 150 could instead be formed of a level seal. This would mean that a groove 50 is not be needed in the wall 30 of the electric cabinet 10. The seal 150 could be positioned between the outer portion 140 of the pressure relief hatch 110 and the wall 30 of the electric cabinet 10. The seal 150 could extend along the whole surface of the outer portion 140 of the pressure relief hatch 150.

The use of a seal 150 is not necessary in all applications. The seal 150 increases the degree of protection of the electric cabinet 10. An electric cabinet 10 with a low IP class does not need a seal, but an electric cabinet 10 with a high IP class e.g. IP 54 needs a seal. The seal 150 increases the tightness of the electric cabinet 10. The seal 150 may also be formed of a seal material e.g. silicon or polyurethane which is applied on the outer surface 31 of the wall 30 or on the inner surface 112 or on the perimeter 113 of the pressure relief hatch 100.

The form of the pressure relief hatch 100 provides for a strong construction having a maximum exhaust area, an efficient flow path for exhaust gases, and a small mass.

The outer perimeter 123 of the centre portion 120 of the body 110 of the pressure relief hatch 100 may be positioned at a radial distance S1 inwards from the edge 210 of the opening 200 in the wall 30 of the electric cabinet 10 in a closed position of the pressure relief hatch 100. The radial distance S1 may be in the range of 10 to 40% of a diagonal extending between the edge 210 of the opening 200.

The thickness T3 of the outer portion 140 of the body 110 of the pressure relief hatch 100 may be smaller than the thickness T1 of the centre portion 120 of the body 110 of the pressure relief hatch 100.

The thickness T3 of the outer portion 140 of the body 110 of the pressure relief hatch 100 may be in the range of 10 to 40% of the thickness T1 of the centre portion 120 of the body 110 of the pressure relief hatch 100.

The outer diameter D1 of the centre portion 120 in the body 110 of the pressure relief hatch 100 may be smaller than the diameter D4 of the opening 200 in the wall 30.

The outer diameter D1 of the centre portion 120 of the body 110 of the pressure relief hatch 100 may be in the range of 10 to 80% of the diameter D4 of the opening 200 in the wall 30.

The diameter D4 of the opening 200 in the wall 30 may be substantially the same as the outer diameter D2 of the intermediate portion 130 of the body 110 of the pressure relief hatch 110.

The diameter D4 of the opening 200 in the wall 30 may be smaller than the outer diameter D3 of the pressure relief hatch 110.

The diameter D4 of the opening 200 in the wall 30 may be in the range of 60 to 90% of the outer diameter D3 of the pressure relief hatch 110.

The pressure relief hatch 100 may be made from any stiff enough and preferably non-flammable material. The material could e.g. be non-flammable composites, non-flammable coated plastics, concrete, stone or metal.

The invention is not limited to the examples described above but may vary within the scope of the claims.

The invention claimed is:

1. A pressure relief arrangement comprises:
a pressure relief hatch for closing an opening in a wall in an electric cabinet, the pressure relief hatch comprising a body having an outer surface, an opposite inner surface, an outer perimeter, and a thickness in a direction perpendicular to a radial plane closing the opening, the body comprising including a centre portion having a first thickness, an intermediate portion having a second thickness and extending radially outwards from the centre portion, and an outer portion having a third thickness and extending radially outwards from the intermediate portion to the outer perimeter, the first thickness being greater than the third thickness,
a spring extending across the pressure relief hatch within the electric cabinet, the spring being supported on an inner surface of the wall of the electric cabinet and attached to an inner surface of the centre portion of the pressure relief hatch for keeping the pressure relief hatch in a closed position in the opening during normal operation of the electric cabinet, wherein:
the second thickness decreases in a radially outward direction from the first thickness to the third thickness,
the outer perimeter of the pressure relief hatch extends radially beyond an edge of the opening in the wall so that the inner surface of the outer portion of the body of the pressure relief hatch seats on an outer surface of the wall in a closed position of the pressure relief hatch.

2. The pressure relief arrangement as claimed in claim 1, wherein an outer perimeter of the centre portion of the body of the pressure relief hatch is positioned at a radial distance inwards from the edge of the opening in the wall of the electric cabinet in a closed position of the pressure relief hatch.

3. The pressure relief arrangement as claimed in claim 2, wherein the radial distance is in the range of 10 to 40% of a diagonal extending between the edge of the opening.

4. The pressure relief arrangement as claimed in claim 2, wherein the outer surface of the body of the pressure relief hatch is planar.

5. The pressure relief arrangement as claimed in claim 2, wherein the inner surface of the centre portion of the body of the pressure relief hatch is planar.

6. The pressure relief arrangement as claimed in claim 2, wherein the inner surface of the outer portion of the body of the pressure relief hatch is planar.

7. The pressure relief arrangement as claimed in claim 2, wherein the inner surface of the intermediate portion of the body of the pressure relief hatch is curved.

8. The pressure relief arrangement as claimed in claim 1, wherein the outer surface of the body of the pressure relief hatch is planar.

9. The pressure relief arrangement as claimed in claim 1, wherein the inner surface of the centre portion of the body of the pressure relief hatch is planar.

10. The pressure relief arrangement as claimed in claim 1, wherein the inner surface of the outer portion of the body of the pressure relief hatch is planar.

11. The pressure relief arrangement as claimed in claim 1, wherein the inner surface of the intermediate portion of the body of the pressure relief hatch is curved.

12. The pressure relief arrangement as claimed in claim 1, wherein a seal is positioned between the outer portion of the body of the pressure relief hatch and the wall of the electric cabinet.

13. The pressure relief arrangement as claimed in claim 12, wherein the seal is positioned in a groove surrounding the opening in the wall of the electric cabinet.

14. The pressure relief arrangement as claimed in claim 1, wherein the pressure relief hatch has a circular form.

15. The pressure relief arrangement as claimed in claim 14, wherein also the opening in the wall has a circular form.

16. The pressure relief arrangement as claimed in claim 15, wherein an outer diameter of the centre portion of the body of the pressure relief hatch is in the range of 10 to 80% of a diameter of the opening in the wall.

17. The pressure relief arrangement as claimed in claim 16, wherein an outer diameter of the intermediate portion of the body of the pressure relief hatch is substantially the same as a diameter of the opening in the wall of the electric cabinet.

18. The pressure relief arrangement as claimed in claim 15, wherein an outer diameter of the intermediate portion of the body of the pressure relief hatch is substantially the same as a diameter of the opening in the wall of the electric cabinet.

* * * * *